(12) United States Patent
Aksin et al.

(10) Patent No.: US 7,253,675 B2
(45) Date of Patent: Aug. 7, 2007

(54) BOOTSTRAPPING CIRCUIT CAPABLE OF SAMPLING INPUTS BEYOND SUPPLY VOLTAGE

(75) Inventors: Devrim Y. Aksin, Richardson, TX (US); Mohammad A. Al-Shyoukh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 11/159,005

(22) Filed: Jun. 22, 2005

(65) Prior Publication Data

US 2006/0202742 A1 Sep. 14, 2006

Related U.S. Application Data

(60) Provisional application No. 60/659,705, filed on Mar. 8, 2005.

(51) Int. Cl.
*H03K 17/16* (2006.01)
(52) U.S. Cl. .................. 327/390; 327/589; 327/536
(58) Field of Classification Search ............... None
See application file for complete search history.

(56) References Cited

U.S. PATENT DOCUMENTS 7,049,877 B2 * 5/2006 Clara et al. ............. 327/333

2006/0202735 A1 * 9/2006 Aksin et al. ............. 327/390
2006/0202736 A1 * 9/2006 Aksin et al. ............. 327/390

* cited by examiner

*Primary Examiner*—Quan Tra
*Assistant Examiner*—Terry L. Englund
(74) *Attorney, Agent, or Firm*—Alan K. Stewart; Wade James Brady, III; Frederick J. Telecky, Jr.

(57) ABSTRACT

The bootstrapping circuit capable of sampling inputs beyond supply voltage includes: a bootstrapped switch MN20 coupled between an input node and an output node; a first transistor MP13 having a first end coupled to a control node of the bootstrapped switch MN20; a clock bootstrapped capacitor C13 having a first end coupled to a second end of the first transistor MP13; a second transistor MN27 coupled between the first end of the first transistor MP13 and a supply node, and having a control node coupled to a first clock signal node PHI; a third transistor MN26 coupled between the second end of the first transistor MP13 and the supply node; a charge pump having a first output coupled to a control node of the third transistor MN26; a level shifter having a first output coupled to a second end of the clock bootstrapped capacitor C13; a fourth transistor MN25 coupled between the supply node and a control node of the first transistor MP13, and having a control node coupled to a second output of the charge pump; a capacitor coupled between a second output of the level shifter and a control node of the first transistor; and a fifth transistor MN28 coupled between the control node of the bootstrapped switch MN20 and a common node.

15 Claims, 2 Drawing Sheets

US 7,253,675 B2

BOOTSTRAPPING CIRCUIT CAPABLE OF SAMPLING INPUTS BEYOND SUPPLY VOLTAGE

This application claims priority under 35 USC § 119(e)(1) of provisional application No. 60/659,705 filed Mar. 8, 2005.

FIELD OF THE INVENTION

The present invention relates to electronic circuitry and, in particular, to a bootstrapping circuit capable of sampling inputs beyond supply voltage.

BACKGROUND OF THE INVENTION

Highly integrated power management applications often require the ability to measure voltage quantities that exceed the supply voltage in magnitude. This is primarily due to a basic need to maximize efficiency by running the power management IC with the lowest supply voltage possible, while still maintaining the ability to sample and measure quantities from the surroundings that could well exceed the battery voltage.

In today's highly integrated power management applications, a low power successive approximation register (SAR) analog-to-digital converter (ADC) is usually present to monitor on-chip and off-chip voltage quantities. The need often arises to extend the on-chip ADC range to sample voltage inputs that are greater than the power supply value. The ADC has to run on the lowest battery voltage possible while still maintaining the ability to sample inputs beyond the supply range.

The most widely used prior art bootstrap circuit in ADC applications is shown in FIG. 1. The circuit of FIG. 1 includes transistors MN1-MN10, MP1, and MP2; inverter INV; capacitors C1, C2, and C3; input node IN; output node OUT; clock signal nodes PHI and PHIZ; and source voltage Vdd. NMOS transistor MN1 connected to terminal OUT is the bootstrapped switch. A sampling capacitor (not shown) connects between terminal OUT and ground. This circuit is widely used in pipelined ADC converters to increase the bandwidth of the track and hold circuit at the front end of the converter. Most pipelined ADC converters typically have relatively small fully differential ranges that fall well within the supply range of the chip. As a result, the prior art switch presented in FIG. 1 will do the job just fine.

The circuit of FIG. 1 operates as follows. First consider the charge pump formed by transistors MN8, MN9, capacitors C1 and C2, and the inverter INV. It works as follows, assume that initially the voltage across the capacitors C1 and C2 is zero, when the clock signal PHIZ goes high, the top plate of capacitor C1 goes to supply voltage VDD and since the bottom plates of capacitors C2 and C3 are grounded for this state, those capacitors are charged till their top plates reach voltage VDD−VTN (where VTN is the threshold voltage for NMOS transistors MN9 and MN10). When the clock signal PHIZ goes low, the top plate of capacitor C2 is pushed well above voltage VDD (or 2VDD−VTN to be exact) yielding complete charging of capacitor C1 to VDD through the switch MN8. With the next phase when PHIZ goes high again, since capacitor C1 is charged to VDD, the top plate of capacitor C1 will be pushed to 2 VDD (two times voltage VDD) and capacitors C2 and C3 will be completely charged to VDD. In steady state, capacitors C1, C2, and C3 will charged to VDD and the voltage on the top plates of capacitors C1 and C2 will change between VDD and 2 VDD. The classical bootstrapped switch reaches its steady state after at least one clock period.

Under the assumption that all the capacitors are charged to VDD, the bootstrapped switch operates as follows: when PHIZ goes high, the bottom plate of capacitor C3 is grounded and switch MN10 is on, hence capacitor C3 is charged to VDD; switch MP2 is also on, driving the gate of transistor MP1 to VDD, hence transistor MP1 is off and finally transistor MN6 is on and grounds the gate terminal of the main switch MN1. Since their gate terminal is grounded, transistors MN3, MN2, and MN1 are off. During this phase, the switch MN1 disconnects the input node IN from the output node OUT and capacitor C3 is charged to VDD. When PHIZ goes low, since transistor MN6 is off, the gate terminal of MN1 becomes high impedance. Initially, the bottom plate of capacitor C3 is floating, but because of the fact that switch MN4 connects capacitor C3 between the gate and source terminal of transistor MP1, this transistor turns on immediately and the charge stored on capacitor C3 starts flowing to the gate terminal of main switch MN1. While the gate voltage of switch MN1 rises, transistor MN2 turns on and forces the bottom plate of capacitor C3 towards the input voltage VIN, which pushes the top plate of capacitor C3 to voltage VDD+VIN. Eventually this voltage appears at the gate of transistor MN1 and as a result transistor MN1 turns on completely to connect the input terminal IN to the output terminal OUT. Transistor MN2 turns on completely to connect input terminal IN to the bottom terminal capacitor C3 and transistor MN3 turns on completely to drive the gate of transistor MP1 to the input voltage level. The gate-to-source voltages of all these four switches MN1, MN2, MN3 and MP1, are all equal to VDD. An important detail about device reliability is the following: even though the bootstrapped switch can be turned on by pulling the gate terminal of MP1 to ground, if the input signal is equal to VDD then the voltage difference between the gate and source of transistor MP1 would be 2VDD. For this reason, during this phase the bootstrapped switch MN1 is turned on, the gate voltage on transistor MP1 is forced to the input signal through the switch MN3 so that the gate-to-source voltage of transistor MP1 is bounded within VDD, and hence the reliability is enhanced. The main challenge of this switch is the design of the scheme that protects MP1 by restricting maximum voltage appearing across its terminals.

Even though the prior art switch in FIG. 1 performs well for input signal levels that are within the supply range, it is useless when the input signal exceeds the supply voltage. The reason is the following: When the switch is turned on, input voltage appears at the gate of transistor MP1. As mentioned previously, this is necessary in order to restrict the gate-to-source voltage of this device to VDD. Since switch MP2 is a PMOS transistor, if its drain voltage exceeds the supply voltage (because the input signal is greater than VDD), the parasitic drain-substrate diode of this device will be forward biased, which will yield a huge current flow through the path formed by transistors MN2 and MN3, and the parasitic body diode of transistor MP2. This current path renders the prior art bootstrapped switch useless for applications where input signal level exceeds supply voltage. The body diode that would be activated here is that between the drain D of transistor MP2 and the bulk B of transistor MP2, shown in FIG. 2. A cross-section of transistor MP2, shown in FIG. 2, includes p type region p; n type region n; drain D; gate G; source S; and bulk B.

SUMMARY OF THE INVENTION

A bootstrapping circuit capable of sampling inputs beyond supply voltage includes: a bootstrapped switch coupled between an input node and an output node; a first transistor having a first end coupled to a control node of the bootstrapped switch; a clock bootstrapped capacitor having a first end coupled to a second end of the first transistor; a second transistor coupled between the first end of the first transistor and a supply node, and having a control node coupled to a first clock signal node; a third transistor coupled between the second end of the first transistor and the supply node; a charge pump having a first output coupled to a control node of the third transistor; a level shifter having a first output coupled to a second end of the clock bootstrapped capacitor; a fourth transistor coupled between the supply node and a control node of the first transistor, and having a control node coupled to a second output of the charge pump; a capacitor coupled between a second output of the level shifter and a control node of the first transistor; and a fifth transistor coupled between the control node of the bootstrapped switch and a common node.

DETAILED DESCRIPTION OF PREFERRED EMBODIMENTS

A bootstrapping circuit, according to the present invention, enables the precise sampling of input signals larger than the chip supply voltage with minimal power consumption overhead. The bootstrapped switch enables extending the range of low power SAR ADCs beyond supply voltage enabling a greater dynamic range, while minimizing power consumption. This is very useful in highly integrated power management applications where multi-channel SAR ADCs are utilized to measure off-chip voltage quantities that could well exceed the supply voltage. The prior art bootstrapped switches cannot be used to sample voltage inputs greater than the supply voltage, without suffering from huge power losses due to parasitic body diodes that get forward biased as the input exceeds the supply. This solution is cost-effective to fabricate and does not introduce any more stresses on the devices than a standard bootstrapping switch would.

Power consumption is minimized in the present invention since the switch consumes no static power and suffers from no parasitic body diodes that get turned on when the input voltage exceeds the supply voltage. Prior art bootstrap switches suffer from huge currents through drain-bulk body diode junctions which render them useless for sampling input signals that exceed the supply voltage.

The bootstrapped switch, according to the present invention, operates with minimal power consumption since no static currents are needed to keep the switch operational. Furthermore, all body diode junctions in the switch are reverse biased for the entire input voltage range including voltages that are greater than the supply voltage. Prior art bootstrapped switches (for example, the type used in pipelined ADC Converters) would suffer from forward biased body diode junctions in the event of feeding an input signal greater than the supply voltage.

Figure 1:
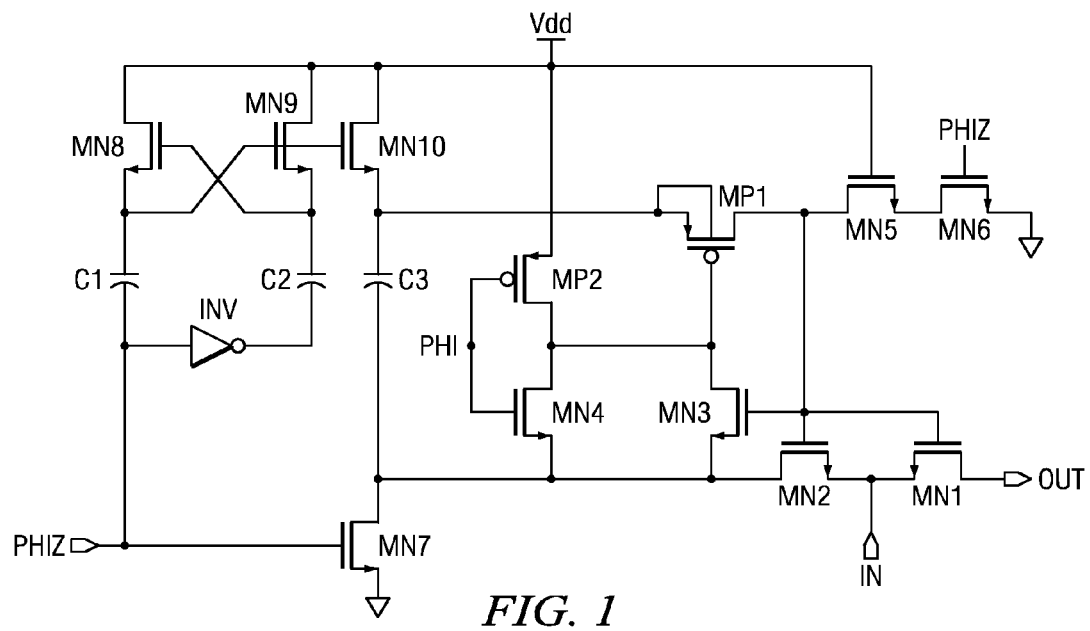
FIG. 1 is a circuit diagram of a prior art bootstrap circuit.
Figure 2:
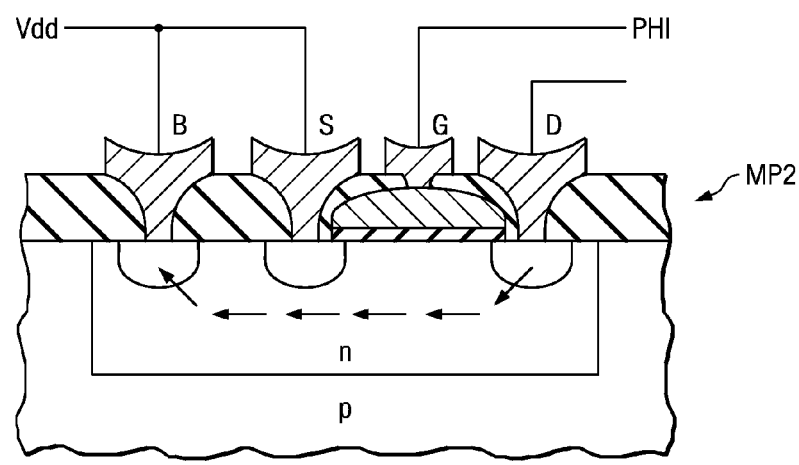
FIG. 2 is a cross-section of a transistor shown in FIG. 1.
Figure 3:
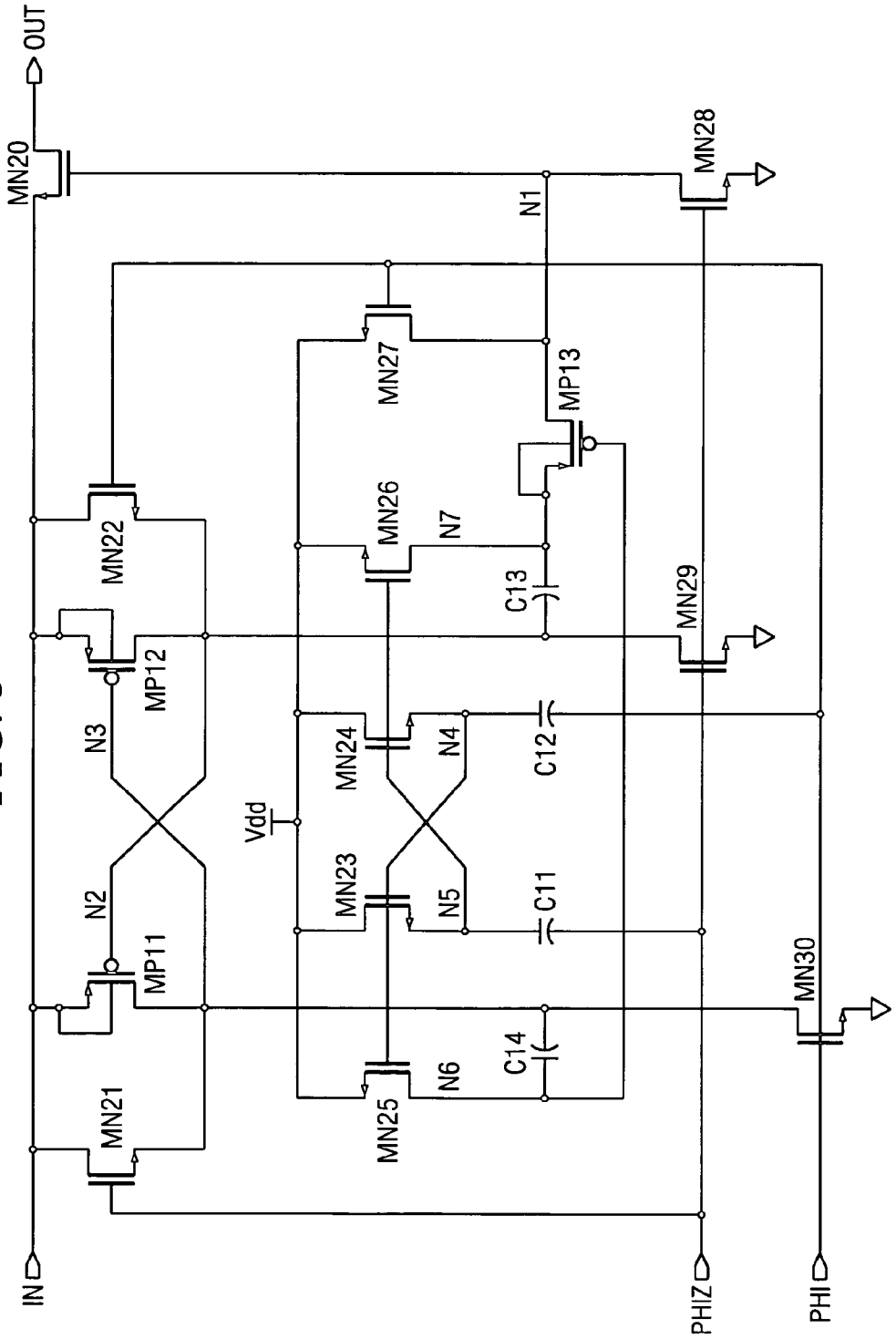
FIG. 3 is a circuit diagram of a preferred embodiment bootstrapping circuit, according to the present invention.

FIG. 3 shows a preferred embodiment bootstrapped switch, according to the present invention. The circuit of FIG. 3 includes NMOS transistors MN20-MN30; PMOS transistors MP11, MP12, and MP13; capacitors C11-C14; supply node Vdd; input node IN; clock signals PHI and PHIZ; and output node OUT. The bootstrapped switch is NMOS transistor MN20 that is connected to the output node OUT. Clock signal PHIZ is clock signal PHI inverted. Capacitor C13 is the clock-bootstrapped capacitor. Transistors MN23 and MN24, and capacitors C11 and C12 form a charge pump.

Transistors MP11, MP12, MN21, MN22, MN29, and MN30 form a simple level shifter. This level shifter is used in digital designs when it is necessary to convey a logic signal to a digital block having different power supply level. When the differential logic signals PHI and PHIZ are applied to transistors MN30 and MN29, the positive feedback created by PMOS transistors MP11 and MP12 forces one of the nodes N2 or N3 to go to ground and the other to go to input voltage level Vin. The transistors MN21 and MN22 are used to guarantee this behavior when the input signal level is very low (close or equal to the threshold voltage of transistor MP11 and MP12). If the input signal is low, there isn't enough gate over-drive for transistors MP11 and MP12 to switch the state of the level shifter. In this case transistor MN21 or MN22, driven by the clock signals, will act as a switch and drive the appropriate output node to the input voltage. To prevent meta-stable condition, transistors MN29 and MN30 should be designed much stronger than transistors MP11 and MP12. This level shifter operates such that nodes N2 and N3 change between ground and Vin, at alternate phases.

The switch will reach its steady state operation after only 1 clock cycle has passed, which is also the same amount of cycles it takes the prior art switch to reach its steady state. After that first clock cycle has passed capacitors C11, C12, C13 and C14 can be assumed to have initial conditions of the supply voltage VDD.

A description of the operation of the circuit of FIG. 3 begins with the aforementioned initial conditions and with the clock PHI being low. The state of every device and every node in the circuit needs to be identified just before clock signal PHI transitions from low to high. The same thing should then be done at the instance just before clock signal PHI goes from high to low. The summary below records that state of the circuit at each one of those two instances:

When signal PHI is low:

Transistor MN29 will turn ON, transistor MN30 will turn OFF.

The bottom plate of capacitor C13 will be grounded.

Node N5 will be pushed to two times supply voltage VDD since the bottom plate of capacitor C11 will be at voltage VDD.

Transistor MN26 will therefore turn ON charging the top plate of capacitor C13 at node N7 to voltage VDD.

Node N4 will be at voltage VDD and the bottom plate of capacitor C12 will be grounded.

Transistor MN27 is OFF, transistor MN24 is ON, and transistor MN23 is OFF.

Transistor MN28 is ON grounding the bootstrapped NMOS switch MN20.

The top plate of capacitor C12 will be charging to voltage VDD because node N5 is pushed to two times voltage VDD.

Node N6 gets pushed to voltage VDD+VIN since the bottom plate of capacitor C14 is pushed to voltage VIN.

Transistor MN25 will be OFF and no body diodes will be turned on since node N6 (the drain of transistor MN25) is at a higher voltage than both its source and its bulk.

Transistor MP13 is OFF because its gate (node N6) is at voltage VDD+VIN, while its source (node N7) is at voltage VDD. (Transistor MP13 must have a gate-to-source voltage (Vgs) breakdown voltage that is less than input voltage VIN). Again no body diodes will be turned on because the drain of transistor MP13 is at zero.

If input voltage VIN is low, transistor MN21 will do the job of transistor MP11 and charge the bottom plate of capacitor C14 to input voltage VIN.

When PHI is high:

Transistor MN30 will turn ON, transistor MN29 will turn OFF.

The bottom plate of capacitor C13 will be pushed to input voltage VIN as a result.

Node N4 will be pushed to two times supply voltage VDD since the bottom plate of capacitor C12 will be pushed to voltage VDD.

Node N5 will be at voltage VDD and the bottom plate of capacitor C11 will be grounded.

Transistor MN23 will be ON and transistor MN24 will be OFF.

Transistor MN25 will be ON and the top plate of capacitor C14 will charge to voltage VDD.

Transistor MN28 is OFF and therefore the node driving the bootstrapped switch (node N1) is released.

Node N7 will be pushed to voltage VDD+VIN since the bottom plate of capacitor C13 is pushed to voltage VIN.

Transistor MN26 will be OFF and no body diodes will be turned on since node N7 (the drain of transistor MN26) is at a higher voltage than both its source and its bulk.

Transistor MN27 will want to charge node N1 to voltage VDD−Vtn (where Vtn is the NMOS transistor threshold voltage).

Transistor MN27 will be ON but conducting only in the other direction (i.e. from source to drain) until node N1 reaches voltage VDD−Vtn Transistor MP13 is ON because its gate (node N6) is at voltage VDD, while its source (node N7) is at voltage VDD+VIN. Voltage Vgs of MP13 is therefore equal to voltage VIN. This will short node N1 to node N7 which is at voltage VDD+VIN for all input voltage VIN values greater than the threshold voltage Vt of transistor MP13.

In the event that node N1 goes to a higher voltage than voltage VDD (i.e. if transistor MP13 is on) transistor MN27 will turn off and no body diodes will be turned on.

In the event that the Vgs on transistor MP13, which is equal to voltage VDD−(VDD+VIN)=VIN, is not sufficient to turn on transistor MP13 (low values of voltage VIN), transistor MN27 will still charge node N1 to voltage VDD−Vt.

From the above it can be seen that the Vgs of the bootstrapped switch will at least be equal to voltage VDD−2Vt (where 2Vt is two times the threshold voltage). This condition happens when input voltage VIN is slightly less than the threshold voltage Vt of transistor MP13. Since the worst case gate voltage of the bootstrapped switch is at voltage VDD−Vt and voltage VIN is at Vt, the worst case Vgs is at least voltage VDD−2Vt. This will be more than enough to turn on the bootstrapped switch when signal PHI is high. For VIN values that are greater than the Vt of transistor MP13, the Vgs of the bootstrapped switch will always be at voltage VDD. It can also be seen that no body diodes are activated for the entire input voltage VIN range and that the energy losses in this switch are limited to shoot through currents when the switch changes state as well as the charging and discharging of the capacitive nodes in the circuit.

The circuit of FIG. 3 is a robust switch capable of switching in input voltages that are higher than the power supply at minimal losses in power. Furthermore, the circuit is reliable and imposes no worse stressing conditions on the gate oxides of the devices than those stresses in a traditional bootstrap circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bootstrapping circuit capable of sampling inputs beyond supply voltage comprising:
    a bootstrapped switch coupled between an input node and an output node;
    a first transistor having a first end coupled to a control node of the bootstrapped switch;
    a first capacitor having a first end coupled to a second end of the first transistor;
    a second transistor coupled between the first end of the first transistor and a supply node, and having a control node coupled to a first clock signal node;
    a third transistor coupled between the second end of the first transistor and the supply node;
    a charge pump having a first output coupled to a control node of the third transistor;
    a level shifter having a first output coupled to a second end of the first capacitor; and
    a fourth transistor coupled between the supply node and a control node of the first transistor, and having a control node coupled to a second output of the charge pump.

2. The circuit of claim 1 further comprising a second capacitor coupled between a second output of the level shifter and the control node of the first transistor.

3. The circuit of claim 1 further comprising a fifth transistor coupled between the control node of the bootstrapped switch and a common node.

4. The circuit of claim 1 wherein the level shifter comprises:
    a first level-shifter transistor coupled between the input node and the second end of the first capacitor; and
    a second level-shifter transistor coupled to the input node and cross-coupled with the first level-shifter transistor.

5. The circuit of claim 4 wherein the level shifter further comprises:
    a third level-shifter transistor coupled between the first level-shifter transistor and a common node, and having a control node coupled to a second clock signal node; and
    a fourth level-shifter transistor coupled between the second level-shifter transistor and the common node, and having a control node coupled to the first clock signal node.

6. The circuit of claim 4 wherein the level shifter further comprises:
    a third level-shifter transistor coupled in parallel with the first level-shifter transistor and having a control node coupled to the first clock signal node; and
    a fourth level-shifter transistor coupled in parallel with the second level-shifter transistor and having a control node coupled to a second clock signal node.

7. The circuit of claim 5 wherein the level shifter further comprises:
   a fifth level-shifter transistor coupled in parallel with the first level-shifter transistor and having a control node coupled to the first clock signal node; and
   a sixth level-shifter transistor coupled in parallel with the second level-shifter transistor and having a control node coupled to the second clock signal node.

8. The circuit of claim 4 further comprising a second capacitor coupled between the second level-shifter transistor and the control node of the first transistor.

9. The circuit of claim 5 further comprising a second capacitor coupled between the second level-shifter transistor and the control node of the first transistor.

10. The circuit of claim 6 wherein the first and second level-shifter transistors are PMOS transistors and the third and fourth level-shifter transistors are NMOS transistors.

11. The circuit of claim 1 wherein the bootstrapped switch is a transistor.

12. The circuit of claim 1 wherein the bootstrapped switch is an NMOS transistor, the first transistor is a PMOS transistor, and the second and third transistors are NMOS transistors.

13. The circuit of claim 1 wherein the charge pump comprises:
   a first charge-pump transistor coupled to the supply node; and
   a second charge-pump transistor coupled to the supply node and cross-coupled with the first charge-pump transistor.

14. The circuit of claim 13 wherein the charge pump further comprises:
   a first charge-pump capacitor coupled between the first charge-pump transistor and the first clock signal node; and
   a second charge-pump capacitor coupled between the second charge-pump transistor and a second clock signal node.

15. The circuit of claim 14 wherein a control node of the third transistor is coupled to the control node of the first charge-pump transistor.

* * * * *